United States Patent
Shen et al.

(10) Patent No.: US 11,868,154 B2
(45) Date of Patent: Jan. 9, 2024

(54) SIGNAL TRANSMISSION METHOD AND DEVICE

(71) Applicant: LYNXI TECHNOLOGIES CO., LTD., Beijing (CN)

(72) Inventors: Yangshu Shen, Beijing (CN); Xiaohuan Jin, Beijing (CN); Tong Shang, Beijing (CN); Yaolong Zhu, Beijing (CN)

(73) Assignee: LYNXI TECHNOLOGIES CO., LTD., Beijing (CN)

( * ) Notice: Subject to any disclaimer, the term of this patent is extended or adjusted under 35 U.S.C. 154(b) by 110 days.

(21) Appl. No.: 17/910,848

(22) PCT Filed: Sep. 7, 2021

(86) PCT No.: PCT/CN2021/116984
§ 371 (c)(1),
(2) Date: Sep. 12, 2022

(87) PCT Pub. No.: WO2022/052918
PCT Pub. Date: Mar. 17, 2022

(65) Prior Publication Data
US 2023/0112826 A1    Apr. 13, 2023

(30) Foreign Application Priority Data

Sep. 11, 2020 (CN) .......................... 202010955332.0
Sep. 11, 2020 (CN) .......................... 202010955333.5

(51) Int. Cl.
*G06F 1/08* (2006.01)
*H03K 5/156* (2006.01)
*G06F 1/12* (2006.01)

(52) U.S. Cl.
CPC ............. *G06F 1/08* (2013.01); *H03K 5/1565* (2013.01); *G06F 1/12* (2013.01)

(58) Field of Classification Search
CPC ................. G06F 1/12; G06F 1/08; G06F 1/10
See application file for complete search history.

(56) References Cited

U.S. PATENT DOCUMENTS

| 10,248,746 B1 | 4/2019 | Bisht et al. |
| 2002/0122347 A1* | 9/2002 | Frulio ................. G11C 7/1072 365/194 |

(Continued)

FOREIGN PATENT DOCUMENTS

| CN | 106844864 A | 6/2017 |
| CN | 108880539 A | 11/2018 |

(Continued)

OTHER PUBLICATIONS

WIPO, International Search Report dated Nov. 23, 2021.

*Primary Examiner* — Phil K Nguyen
(74) *Attorney, Agent, or Firm* — Li & Cai Intellectual Property (USA) Office

(57) ABSTRACT

The present disclosure provides a signal transmission method and a signal transmission device, which are applied to a digital circuit including a plurality of circuit modules connected in series, and each circuit module is configured to perform corresponding operation processing based on a first clock signal provided by a first clock. The method includes: under driving of a second clock signal provided by a second clock, transmitting a first signal output by a current circuit module to a target circuit module in response to reception of the first signal, the first signal is a signal output by the current circuit module when operating based on the first clock signal, transmission of the first signal is completed within a current clock cycle of the first clock, and a clock rate of the second clock is greater than that of the first clock.

18 Claims, 6 Drawing Sheets

S1 — under driving of a second clock signal provided by a second clock, transmitting a first signal output by a current circuit module to a target circuit module in response to reception of the first signal

(56) References Cited

U.S. PATENT DOCUMENTS

| | | | | |
|---|---|---|---|---|
| 2003/0097604 A1* | 5/2003 | Inohara | ................... | G06F 1/04 |
| | | | | 713/600 |
| 2008/0273460 A1* | 11/2008 | Lamothe | ................... | H04L 7/02 |
| | | | | 370/231 |
| 2010/0117683 A1 | 5/2010 | Karczmarek et al. | | |
| 2015/0236870 A1* | 8/2015 | Lee | ................... | G06F 1/324 |
| | | | | 370/257 |
| 2015/0295669 A1* | 10/2015 | Chapman | ................... | H04L 27/345 |
| | | | | 370/503 |

FOREIGN PATENT DOCUMENTS

| | | |
|---|---|---|
| CN | 109857190 A | 6/2019 |
| CN | 112100955 A | 12/2020 |
| CN | 112100956 A | 12/2020 |

* cited by examiner

S1 — under driving of a second clock signal provided by a second clock, transmitting a first signal output by a current circuit module to a target circuit module in response to reception of the first signal

FIG. 1

S11 — receiving the second clock signal provided by the second clock

S12 — enabling the first signal to respond to the second clock signal when being triggered on a clock edge of the second clock signal S13 — in the current clock cycle of the first clock, transmitting the first signal output by the current circuit module to the target circuit module in response to the reception of the first signal

FIG. 2

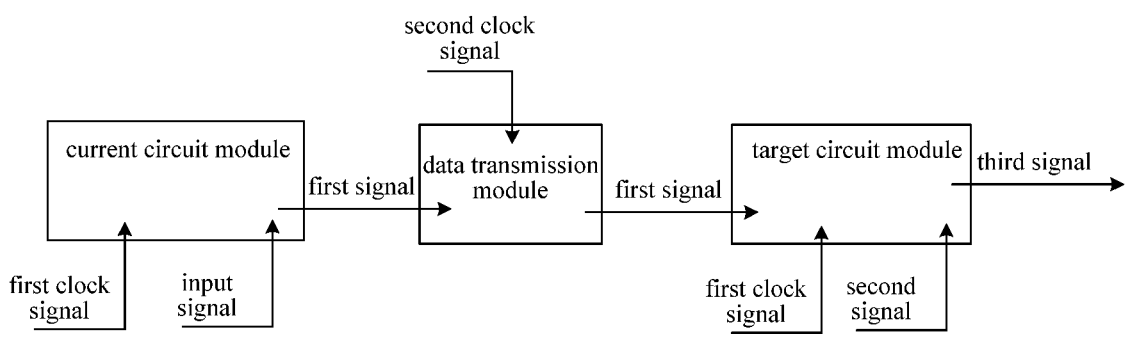

SIGNAL TRANSMISSION METHOD AND DEVICE

CROSS REFERENCE TO RELATED APPLICATIONS

The present application is a National Phase Application filed under 35 U.S.C 371 as a national stage of PCT/CN2021/116984, filed on Sep. 7, 2021, an application claiming priority from Chinese Patent Application No. 202010955333.5, filed on Sep. 11, 2020 in the Chinese Intellectual Property Office and Chinese Patent Application No. 202010955332.0, filed on Sep. 11, 2020 in the Chinese Intellectual Property Office, contents of which are hereby incorporated herein by reference in their entirety.

TECHNICAL FIELD

The present disclosure relates to the technical field of digital circuits, and in particular, to a signal transmission method and device.

BACKGROUND

A large-scale digital circuit is usually designed to perform complex functions. In a process of calculation or analog simulation, data volume involved in calculation or analog simulation is so large that the process of calculation or analog simulation is cumbersome and takes a very long time.

SUMMARY

The present disclosure provides a signal transmission method and device, which divide a circuit into a plurality of circuit modules connected in series to perform their respective functions, and realize transmission of interactive signals between any two adjacent circuit modules through high-speed data transmission, where the transmission of the interactive signals is completed within one low-speed clock cycle.

In a first aspect of the present disclosure, a signal transmission method applied to a digital circuit is provided, the digital circuit includes a plurality of circuit modules connected in series, and each circuit module is configured to perform corresponding operation processing based on a first clock signal provided by a first clock, and the signal transmission method includes: transmitting, under driving of a second clock signal provided by a second clock, a first signal output by a current circuit module to a target circuit module in response to reception of the first signal, wherein the current circuit module and the target circuit module are any two adjacent circuit modules, the first signal is a signal output by the current circuit module when operating based on the first clock signal, transmission of the first signal is completed within a current clock cycle of the first clock, and a clock rate of the second clock is greater than that of the first clock.

In a second aspect of the present disclosure, a signal transmission device applied to a digital circuit is provided, the digital circuit includes a plurality of circuit modules connected in series, and each circuit module is configured to perform corresponding operation processing based on a first clock signal provided by a first clock, and the signal transmission device includes: a data transmission module disposed between any two adjacent circuit modules, and configured to transmit, under driving of a second clock signal provided by a second clock, a first signal output by a current circuit module to a target circuit module in response to reception of the first signal, wherein the current circuit module and the target circuit module are any two adjacent circuit modules, the first signal is a signal output by the current circuit module when operating based on the first clock signal, transmission of the first signal is completed within a current clock cycle of the first clock, and a clock rate of the second clock is greater than that of the first clock.

In a third aspect of the present disclosure, an electronic device is provided, and includes a memory configured to store one or more computer instructions, and a processor, wherein when the one or more computer instructions are executed by the processor, the processor implements the signal transmission method described in the first aspect.

In a fourth aspect of the present disclosure, a computer-readable storage medium having a computer program stored thereon is provided, and when the computer program is executed by a processor, the processor implements the signal transmission method described in the first aspect.

BRIEF DESCRIPTION OF DRAWINGS

In order to illustrate the technical solutions in the embodiments of the present disclosure or the prior art more clearly, drawings for the illustration of the embodiments or the prior art will be briefly described below. Apparently, the drawings described below are merely for some embodiments of the present disclosure, and other drawings can be derived by those of ordinary skill in the art from the drawings described herein without any creative work. In the drawings, FIG. 1 is a flowchart illustrating a signal transmission method according to the present disclosure;

FIG. 2 is a flowchart illustrating a specific implementation of step S1 according to the present disclosure;

FIG. 3 is a schematic diagram of an application scenario of a signal transmission method according to the present disclosure;

DETAIL DESCRIPTION OF EMBODIMENTS

Figure 4:
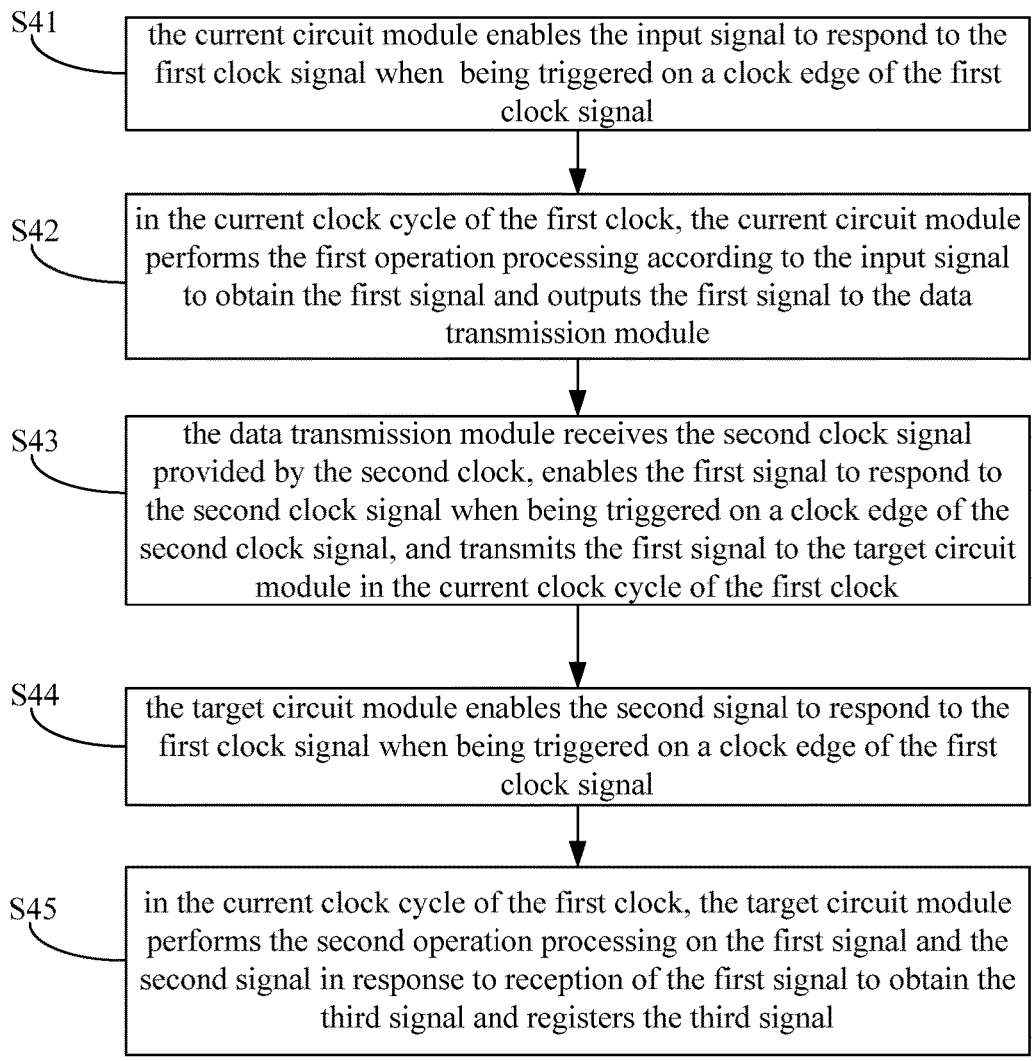
FIG. 4 is another flowchart illustrating a signal transmission method according to the present disclosure.

The technical solutions in the embodiments of the present disclosure will be clearly and completely described below with reference to the drawings for the embodiments of the present disclosure. Apparently, the embodiments described herein are merely some embodiments of the present disclosure, rather than all embodiments. All other embodiments, which are derived by those of ordinary skill in the art based on the embodiments in the present disclosure without any creative work, fall within the scope of the present disclosure.

It should be noted that, if directional indications (such as "on", "under", "left", "right", "front", "back" . . . ) are mentioned in the embodiments of the present disclosure, the directional indications are only used for explaining a relative positional relationship between components and motions of the components in a specific posture (as shown in the drawings), and if the specific posture is changed, the directional indications are changed accordingly.

In addition, all the terms used in the description of the present disclosure are merely for illustration, and are not intended to limit the scope of the present disclosure. The terms "include" and/or "comprise" are used to specify presence of an element, a step, an operation, and/or a component, but do not exclude presence or addition of one or more other elements, steps, operations, and/or components. The terms "first", "second" and the like may be used to describe various elements, but are not used to indicate an order, and are not intended to limit the elements. In addition, unless otherwise stated, the term "a plurality" in the description of the present disclosure means two or more. Those terms are only used to distinguish one element from another. With referent to the drawings below, these and/or other aspects will become apparent and the illustration of the embodiments of the present disclosure will be more readily understood by those of ordinary skill in the art. The drawings are only intended to illustrate the embodiments of the present disclosure. Based on the following description, those of ordinary skill in the art may readily envisage adopting alternative implementations of the structures and the methods illustrated herein without departing from the principle described in the present disclosure.

FIG. 1 is a flowchart illustrating a signal transmission method according to the present disclosure. The present disclosure provides a signal transmission method applied to a digital circuit which includes a plurality of circuit modules connected in series, each circuit module is configured to perform corresponding operation processing based on a first clock signal provided by a first clock, a corresponding data transmission module is provided between any two adjacent circuit modules, and is configured to enable signal transmission between the two adjacent circuit modules. The signal transmission method provided by the present disclosure is implemented based on the data transmission module. As shown in FIG. 1, the signal transmission method includes step S1.

At step S1, transmitting, under driving of a second clock signal provided by a second clock, a first signal output by a current circuit module to a target circuit module in response to reception of the first signal.

The current circuit module and the target circuit module are any two adjacent circuit modules, the first signal is a signal output by the current circuit module when operating based on the first clock signal, the transmission of the first signal is completed within a current clock cycle of the first clock, the first clock is a low-speed clock, the second clock is a high-speed clock, and a clock rate H2 of the second clock is greater than a clock rate H1 of the first clock.

According to the technical solution of the signal transmission method provided by the present disclosure, a large-scale digital circuit may be logically divided according to functions to be performed thereby, a plurality of circuit modules obtained by the division and connected in series can perform their respective functions (perform corresponding operation processing, such as a combinational logic operation processing), and data transmission is controlled by the high-speed clock to allow operation processing of the plurality of circuit modules and transmission of interactive signals between any two adjacent circuit modules to be completed within one clock cycle of the low-speed clock (e.g., the first clock with a clock rate of 1 MHz). The whole process takes one low-speed clock cycle without consuming any additional low-speed clock cycle, so that the large-scale circuit can produce, when performing simulation, a complete simulation effect which is same as an effect produced in a case where all the circuit modules perform calculation as a whole circuit module.

The interactive signals between any two adjacent circuit modules may be determined according to the circuit modules obtained by the division. For example, for two adjacent circuit modules (i.e., a current circuit module and a target circuit module) which interact with each other, the interactive signals therebetween may be a signal which needs to be output to the target circuit module by the current circuit module after performing corresponding operation processing, and a signal which needs to be fed back to the current circuit module by the target circuit module after performing corresponding operation processing.

The first clock signal may be a synchronous clock signal provided for each independent circuit module in the entire large-scale circuit, and may trigger on a rising edge or a falling edge (hereinafter referred to as a clock edge) to enable each circuit module to perform corresponding operation processing under driving of the first clock signal, and a triggering way of the first clock signal is not limited herein. Different from the first clock signal, the second clock signal is a clock signal provided for the transmission of the first signal, and may trigger on a rising edge or a falling edge (hereinafter referred to as the clock edge) to enable the data transmission module between any two adjacent circuit modules to perform signal transmission, and a triggering way of the second clock signal is not limited herein. The first clock and the second clock have different clock rates and different clock cycles, and the clock rate of the second clock is greater than that of the first clock.

In an implementation, the first signal output by the current circuit module includes at least one of the following signals: a signal obtained by the current circuit module when performing operation processing in the current clock cycle of the first clock; and a signal obtained by the current circuit module when performing operation processing in a historical clock cycle of the first clock, with the historical clock cycle being a clock cycle before the current clock cycle.

In an implementation, the first signal includes the signal obtained by the current circuit module when performing the operation processing in the current clock cycle of the first clock, and the current circuit module is controlled by the first clock signal.

The current circuit module is configured to: enable an input signal of the current circuit module to respond to the first clock signal when being triggered on a clock edge of the first clock signal; and, in the current clock cycle of the first clock, perform a first operation processing according to the input signal to obtain the first signal and output the first signal to the data transmission module, the first operation processing is completely performed within the current clock cycle of the first clock.

FIG. 2 is a flowchart illustrating a specific implementation of step S1 according to the present disclosure. As shown in FIG. 2, in an implementation, transmitting the first signal output by the current circuit module to the target circuit module in response to the reception of the first signal (step S1) may include steps S11 to S13.

At step S11, receiving the second clock signal provided by the second clock.

At step S12, enabling the first signal to respond to the second clock signal when being triggered on a clock edge of the second clock signal.

At step S13, transmitting, in the current clock cycle of the first clock, the first signal output by the current circuit module to the target circuit module in response to the reception of the first signal.

The target circuit module is configured to perform a second operation processing according to the first signal and a second signal, and the second operation processing is completely performed within the current clock cycle of the first clock.

In an implementation, the second signal includes at least one of the following signals: an input signal of the target circuit module; a signal obtained by the target circuit module when performing operation processing in the current clock cycle of the first clock; and a signal obtained by the target circuit module when performing operation processing in a historical clock cycle of the first clock, with the historical clock cycle being a clock cycle before the current clock cycle.

In an implementation, the target circuit module is controlled by the first clock signal.

The target circuit module is configured to: enable the second signal to respond to the first clock signal when being triggered on a clock edge of the first clock signal; and in the current clock cycle of the first clock, perform the second operation processing according to the second signal and the first signal to obtain a third signal in response to the reception of the first signal of the current circuit module.

FIG. 3 is a schematic diagram of an application scenario of a signal transmission method according to the present disclosure. Illustratively, as shown in FIG. 3, a large-scale digital circuit is divided into two circuit modules, including a current circuit module and a target circuit module, which perform a first operation processing and a second operation processing respectively. The two circuit modules are both controlled by the first clock signal provided by one first clock (e.g., a low-speed clock with a clock rate of 1 MHz), and a data transmission module is provided between the current circuit module and the target circuit module. Interactive signals between the two circuit modules include a first signal which needs to be output to the target circuit module by the current circuit module after performing the first operation processing.

The current circuit module may perform the first operation processing according to the input signal and/or a registered signal to obtain the first signal. The registered signal may be a signal obtained by the current circuit module when performing operation processing in a historical clock cycle of the first clock, with the historical clock cycle being a clock cycle before the current clock cycle.

FIG. 4 is another flowchart illustrating a signal transmission method according to the present disclosure, and the signal transmission method is applied to the digital circuit shown in FIG. 3, and includes the following steps S41 to S45.

At step S41, the current circuit module enables the input signal to respond to the first clock signal when being triggered on a clock edge of the first clock signal.

At step S42, in the current clock cycle of the first clock, the current circuit module performs the first operation processing according to the input signal to obtain the first signal and outputs the first signal to the data transmission module.

At step S43, the data transmission module receives the second clock signal provided by the second clock, enables the first signal to respond to the second clock signal when being triggered on a clock edge of the second clock signal, and transmits the first signal to the target circuit module in the current clock cycle of the first clock.

At step S44, the target circuit module enables the second signal to respond to the first clock signal when being triggered on a clock edge of the first clock signal.

At step S45, in the current clock cycle of the first clock, the target circuit module performs the second operation processing on the first signal and the second signal in response to reception of the first signal to obtain the third signal and registers the third signal.

The first clock and the second clock have different clock rates and different clock cycles, the first clock signal provided by the first clock is used for controlling each circuit module to perform corresponding operation processing, and the second clock signal provided by the second clock is used for controlling the transmission of the interactive signals between two adjacent circuit modules. When one clock cycle of the first clock starts, the current circuit module starts to perform the first operation processing to obtain the first signal, the first signal is transmitted to the target circuit module through the data transmission module, and the target circuit module performs the second operation processing on the first signal and the second signal to obtain the third signal. The first operation processing, the second operation processing, and the transmission of the interactive signals (the first signal) between the two circuit modules are all completed within one clock cycle of the first clock, and are simultaneously completed within a plurality of clock cycles of the second clock.

Figure 5:
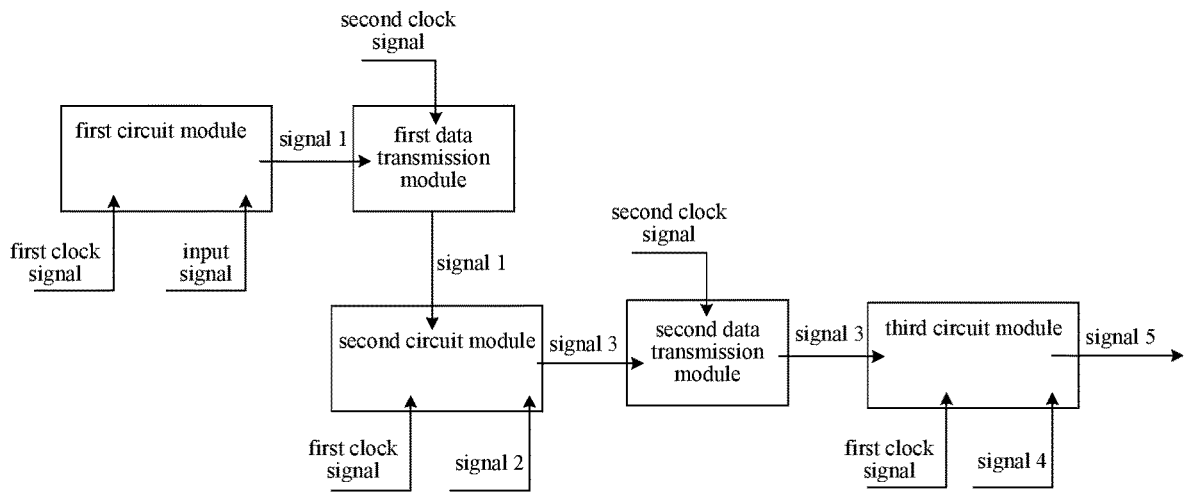
FIG. 5 is another schematic diagram of an application scenario of a signal transmission method according to the present disclosure.

FIG. 5 is another schematic diagram of an application scenario of a signal transmission method according to the present disclosure. As shown in FIG. 5, in an implementation, a digital circuit may be divided into three circuit modules. When any two adjacent circuit modules among the three circuit modules perform signal transmission, a transmitting end of a signal is referred to as a current circuit module, and a receiving end of the signal is referred to as a target circuit module. For conveniently distinguishing among the three circuit modules, the three circuit modules are referred to as a first circuit module, a second circuit module and a third circuit module, which perform operation processing A1, operation processing A2 and operation processing A3 respectively. The three circuit modules are all controlled by the first clock signal provided by one first clock (e.g., a low-speed clock with a clock rate of 1 MHz), a first data transmission module is provided between the first circuit module and the second circuit module, and a second data transmission module is provided between the second circuit module and the third circuit module. The first data transmission module is configured to enable transmission of interactive signals between the first circuit module and the second circuit module based on the above signal transmission methods, and the second data transmission module is configured to enable transmission of interactive signals between the second circuit module and the third circuit module based on the above signal transmission methods, that is, the interactive signals between any two adjacent circuit modules may be transmitted with the signal transmission method provided in any of the above embodiments.

As shown in FIG. 5, for the first circuit module and the second circuit module which are adjacent to each other, the interactive signals therebetween are signal 1 which needs to be output to the second circuit module after the first circuit module performs a first operation processing. For the second circuit module and the third circuit module which are adjacent to each other, the interactive signals therebetween are signal 3 which needs to be output to the third circuit module after the second circuit module performs a second operation processing. When the current clock cycle of the first clock starts, the first circuit module starts to perform the operation processing A1 to obtain the signal 1 and outputs the signal 1 to the first data transmission module. The first data transmission module transmits the signal 1 to the second circuit module. The second circuit module performs the operation processing A2 according to signal 2 and the signal 1 to obtain signal 3, registers the signal 3, and then outputs the signal 3 to the second data transmission module. The second data transmission module transmits the signal 3 to the third circuit module. The third circuit module performs the operation processing A3 according to the signal 3 and signal 4 to obtain signal 5, registers the signal 5, and then outputs the signal 5. The operation processing A1, the transmission of the signal 1, and the operation processing A2 are all completed within the current clock cycle of the first clock, and the transmission of the signal 3 and the operation processing A3 are also completed within the current clock cycle of the first clock. The operation processing of the plurality of circuit modules and the transmission of the interactive signals are performed in a pipelining way. It should be understood that, for the first circuit module and the second circuit module which are adjacent to each other, the signal 1 is the above first signal, the signal 2 is the above second signal, and the signal 3 is the above third signal; and for the second circuit module and the third circuit module which are adjacent to each other, the signal 2 is an input signal and/or a registered signal of the second circuit module, the signal 3 is the above first signal, the signal 4 is the above second signal, and the signal 5 is the above third signal.

Figure 6:
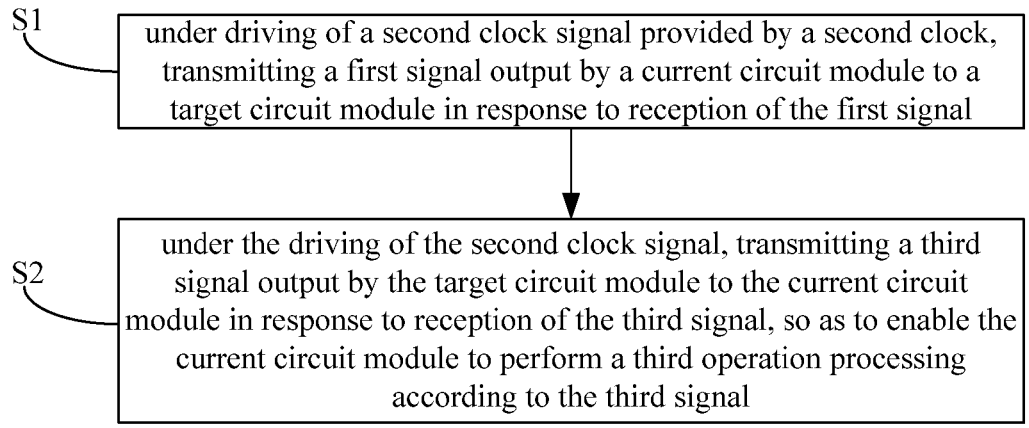
FIG. 6 is yet another flowchart illustrating a signal transmission method according to the present disclosure.

In an implementation, the first signal output by the current circuit module to the target circuit module is a serial signal between the current circuit module and the target circuit module, and a value of the first signal affects a value of a signal obtained after the target circuit module performs operation processing. FIG. 6 is yet another flowchart illustrating a signal transmission method according to the present disclosure. As shown in FIG. 6, in an implementation where the first signal is the serial signal between the current circuit module and the target circuit module, the signal transmission method includes the following steps S1 to S2.

At step S1, transmitting, under driving of a second clock signal provided by a second clock, a first signal output by a current circuit module to a target circuit module in response to reception of the first signal.

A detailed description of step S1 may be found in the above description, and will not be repeated here.

At step S2, transmitting, under the driving of the second clock signal, a third signal output by the target circuit module to the current circuit module in response to reception of the third signal, so as to enable the current circuit module to perform a third operation processing according to the third signal.

In step S2, the third signal is enabled to respond to the second clock signal when being triggered on a clock edge of the second clock signal, and the third signal is transmitted to the current circuit module within one clock cycle of the first clock, so as to enable the current circuit module to perform the third operation processing according to the third signal.

The third signal is a signal which needs to be fed back to the current circuit module by the target circuit module after performing the second operation processing according to the first signal, the third operation processing is completely performed within the current clock cycle of the first clock, and transmission of the third signal is completed within the current clock cycle of the first clock.

In an implementation, the current circuit module is configured to: enable a fourth signal to respond to the first clock signal when being triggered on a clock edge of the first clock signal; and in the current clock cycle of the first clock, perform the third operation processing according to the third signal and the fourth signal in response to reception of the third signal to obtain a fifth signal, and register the fifth signal.

The fourth signal includes at least one of the following signals: an input signal received by the current circuit module in the current clock cycle of the first clock; a signal obtained by the current circuit module when performing operation processing in the current clock cycle of the first clock; and a signal obtained by the current circuit module when performing operation processing in a historical clock cycle of the first clock, with the historical clock cycle being a clock cycle before the current clock cycle.

Figure 7:
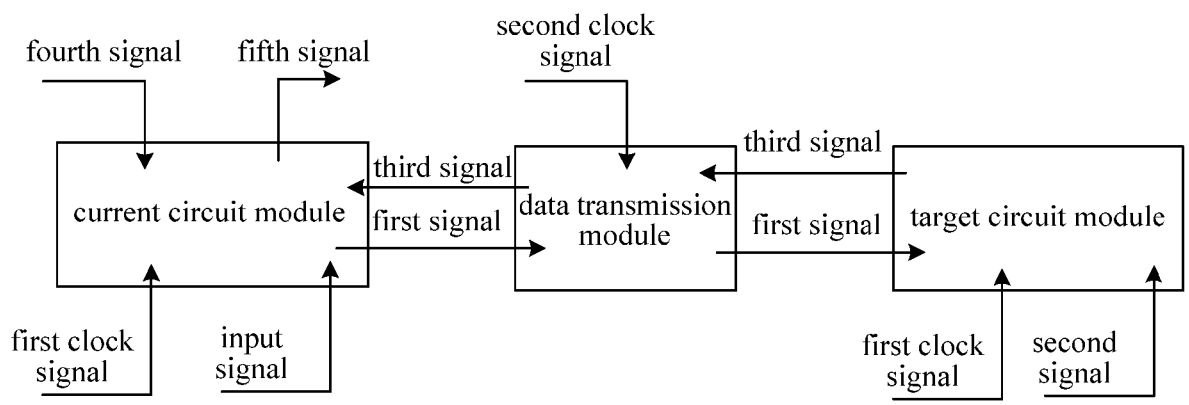
FIG. 7 is yet another schematic diagram of an application scenario of a signal transmission method according to the present disclosure.

FIG. 7 is yet another schematic diagram of an application scenario of a signal transmission method according to the present disclosure. Illustratively, as shown in FIG. 7, a large-scale digital circuit is divided into two circuit modules, including a current circuit module and a target circuit module. The current circuit module performs a first operation processing and a third operation processing, the target circuit module performs a second operation processing, the two circuit modules are both controlled by the first clock signal provided by one first clock (e.g., a low-speed clock with a clock rate of 1 MHz), and a data transmission module is provided between the current circuit module and the target circuit module. Interactive signals between the two circuit modules include a first signal to be output to the target circuit module by the current circuit module after performing the first operation processing, and a third signal fed back to the current circuit module by the target circuit module after performing the second operation processing according to the first signal and a second signal (the first signal is an output signal among the interactive signals, and the third signal is a feedback signal among the interactive signals).

Figure 8:
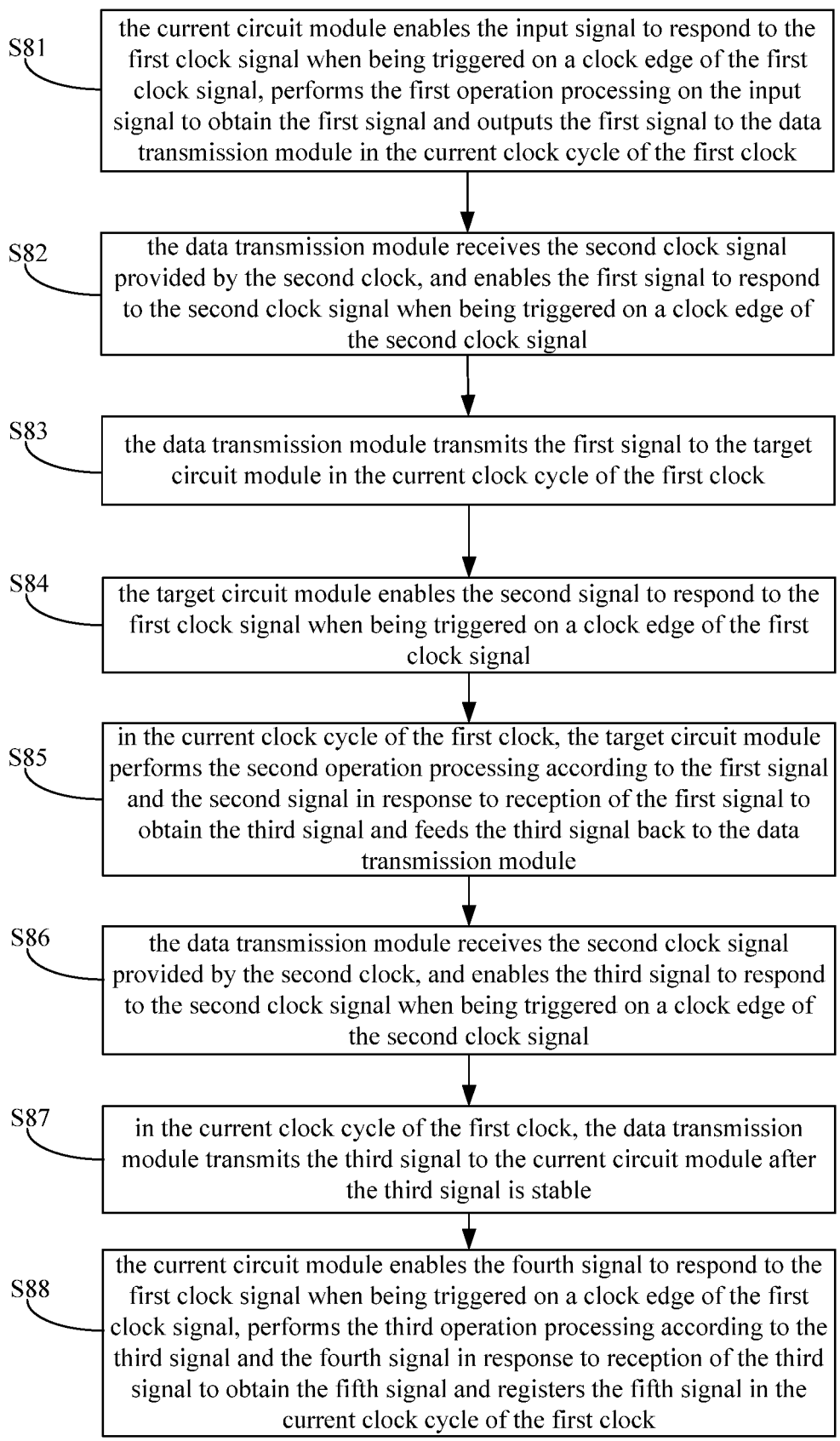
FIG. 8 is still another flowchart illustrating a signal transmission method according to the present disclosure.

FIG. 8 is still another flowchart illustrating a signal transmission method according to the present disclosure, and the signal transmission method is applied to the digital circuit shown in FIG. 7. As shown in FIG. 7 and FIG. 8, the signal transmission method includes the following steps S81 to S88.

At step S81, the current circuit module enables the input signal to respond to the first clock signal when being triggered on a clock edge of the first clock signal, performs the first operation processing on the input signal to obtain the first signal and outputs the first signal to the data transmission module in the current clock cycle of the first clock.

At step S82, the data transmission module receives the second clock signal provided by the second clock, and enables the first signal to respond to the second clock signal when being triggered on a clock edge of the second clock signal is triggered.

At step S83, the data transmission module transmits the first signal to the target circuit module in the current clock cycle of the first clock.

At step S84, the target circuit module enables the second signal to respond to the first clock signal when being triggered on a clock edge of the first clock signal.

At step S85, in the current clock cycle of the first clock, the target circuit module performs the second operation processing according to the first signal and the second signal in response to reception of the first signal to obtain the third signal and feeds the third signal back to the data transmission module.

At step S86, the data transmission module receives the second clock signal provided by the second clock, and enables the third signal to respond to the second clock signal when being triggered on a clock edge of the second clock signal.

At step S87, in the current clock cycle of the first clock, the data transmission module transmits the third signal to the current circuit module after the third signal is stable.

At step S88, the current circuit module enables the fourth signal to respond to the first clock signal when being triggered on a clock edge of the first clock signal, performs the third operation processing according to the third signal and the fourth signal in response to reception of the third signal to obtain the fifth signal and registers the fifth signal in the current clock cycle of the first clock.

The first clock and the second clock have different clock rates and different clock cycles, the first clock signal provided by the first clock is used for each operation processing, and the second clock signal provided by the second clock is used for the transmission of the interactive signals between the two adjacent circuit modules. When the current clock cycle of the first clock starts, the current circuit module starts to perform the first operation processing to obtain the first signal, the first signal is transmitted to the target circuit module through the data transmission module, the target circuit module performs the second operation processing according to the first signal and the second signal to obtain the third signal, the third signal is fed back to the current circuit module through the data transmission module, and the current circuit module performs the third operation processing according to the third signal and the fourth signal to obtain the fifth signal. The first operation processing, the transmission of the first signal, the second operation processing, the transmission of the third signal and the third operation processing are all completed within one clock cycle of the first clock, so that the operation processing of the two circuit modules and the transmission of the interactive signals between the two circuit modules are completed within one clock cycle of the first clock, and are simultaneously completed within a plurality of clock cycles of the second clock.

Figure 9:
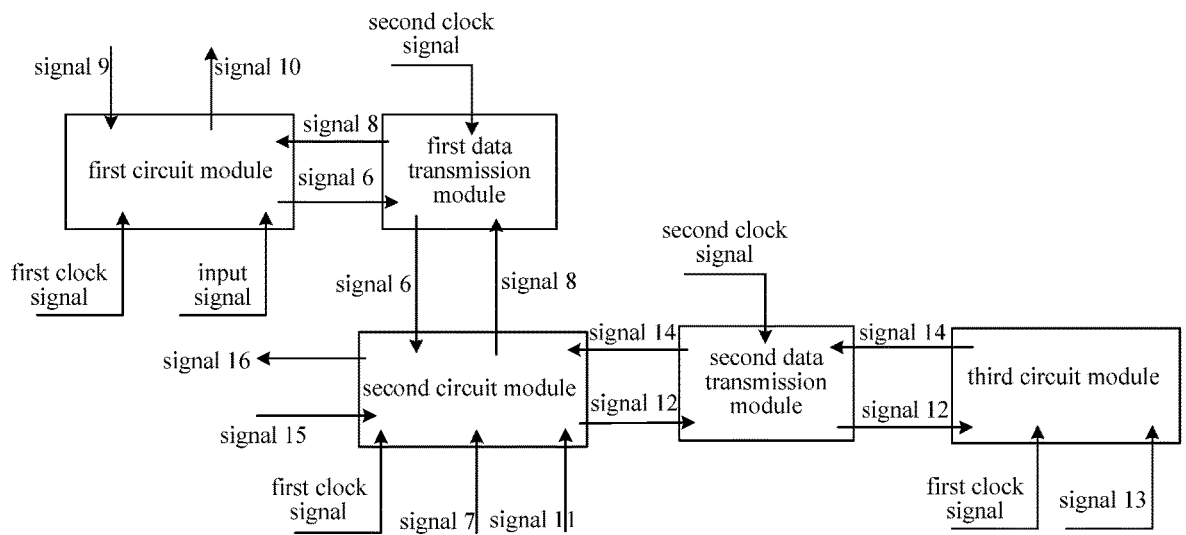
FIG. 9 is still another schematic diagram of an application scenario of a signal transmission method according to the present disclosure.

FIG. 9 is still another schematic diagram of an application scenario of a signal transmission method according to the present disclosure. As shown in FIG. 9, in an implementation, a digital circuit may be divided into three circuit modules. When any two adjacent circuit modules among the three circuit modules perform signal transmission, a transmitting end of a signal is referred to as a current circuit module, and a receiving end of the signal is referred to as a target circuit module. For conveniently distinguishing among the three circuit modules, the three circuit modules are referred to as a first circuit module, a second circuit module and a third circuit module. The first circuit module performs a first operation processing and a third operation processing, the second circuit module performs a second operation processing, a fourth operation processing and a sixth operation processing, and the third circuit module performs a fifth operation processing. The three circuit modules are all controlled by the first clock signal provided by one first clock (e.g., a low-speed clock with a clock rate of 1 MHz), a first data transmission module is provided between the first circuit module and the second circuit module, and a second data transmission module is provided between the second circuit module and the third circuit module. The first data transmission module is configured to enable transmission of interactive signals between the first circuit module and the second circuit module based on the above signal transmission methods, and the second data transmission module is configured to enable transmission of interactive signals between the second circuit module and the third circuit module based on the above signal transmission methods, that is, the interactive signals between any two adjacent circuit modules may be transmitted with the signal transmission method provided in any of the above embodiments.

As shown in FIG. 9, for the first circuit module and the second circuit module which are adjacent to each other, the interactive signals therebetween include signal 6 output to the second circuit module after the first circuit module performs the first operation processing, and signal 8 fed back to the first circuit module after the second circuit module performs the second operation processing according to the signal 6 and signal 7. For the second circuit module and the third circuit module which are adjacent to each other, the interactive signals therebetween include signal 12 output to the third circuit module after the second circuit module performs the fourth operation processing according to signal 11, and signal 14 fed back to the second circuit module after the third circuit module performs the fifth operation processing according to the signal 12 and signal 13.

As shown in FIG. 9, when the current clock cycle of the first clock starts, the first circuit module starts to perform the first operation processing on an input signal to output the signal 6, the first data transmission module transmits the signal 6 to the second circuit module, the second circuit module performs the second operation processing according to the signal 6 and the signal 7 and outputs the signal 8, the signal 8 is transmitted to the first circuit module through the first data transmission module, and the first circuit module performs the third operation processing according to the signal 8 and signal 9 to obtain signal 10.

Meanwhile, as shown in FIG. 9, when the current clock cycle of the first clock starts, the second circuit module performs the fourth operation processing according to the signal 11 to output the signal 12, and the signal 12 is transmitted to the third circuit module through the second data transmission module. The third circuit module performs the fifth operation processing according to the signal 12 and the signal 13 to output the signal 14, the signal 14 is transmitted to the second circuit module through the second data transmission module, and the second circuit module performs the sixth operation processing according to the signal 14 and signal 15 to obtain signal 16. The first operation processing, the transmission of the signal 6, the second operation processing, the transmission of the signal 8 and the third operation processing are all completed within one clock cycle of the first clock; meanwhile, the fourth operation processing, the transmission of the signal 12, the fifth operation processing, the transmission of the signal 14, and the sixth operation processing are completed within one clock cycle of the first clock. The operation processing of the plurality of circuit modules and the transmission of the interactive signals are performed in a pipelining way.

It should be understood that, for the first circuit module and the second circuit module which are adjacent to each other, the signal 6 is the above first signal, the signal 7 is the above second signal, the signal 8 is the above third signal, the signal 9 is the above fourth signal, and the signal 10 is the above fifth signal; and for the second circuit module and the third circuit module which are adjacent to each other, the signal 11 is an input signal and/or a registered signal of the second circuit module, the signal 12 is the above first signal, the signal 13 is the above second signal, the signal 14 is the above third signal, the signal 15 is the above fourth signal, and the signal 16 is the above fifth signal.

It should be understood that no matter how many independent circuit modules the digital circuit is divided into, the operation processing of the plurality of circuit modules and the transmission of the interactive signals are completed within one low-speed clock cycle without consuming any additional low-speed clock cycle, so that transmission delay of several additional low-speed clock cycles does not occur when the whole digital circuit performs analog computation, and a good analog computation effect can be realized.

In an implementation, the signal transmission method further includes: determining the clock rate H2 of the second clock according to the clock rate H1 of the first clock.

In an implementation, determining the clock rate H2 of the second clock according to the clock rate H1 of the first clock includes: determining a channel width W2 of a signal transmission channel between the current circuit module and the target circuit module, and a data width of a signal which needs to be transmitted; and determining the clock rate H2 of the second clock according to the channel width W2 of the signal transmission channel between the current circuit module and the target circuit module, the data width of the signal which needs to be transmitted, and the clock rate H1 of the first clock.

In the present disclosure, the transmission of the interactive signals, i.e., the signals which need to be transmitted, between two adjacent circuit modules is realized by the high-speed data transmission module. The data transmission module serves as the data transmission channel. In some embodiments, the data transmission module is configured to transmit a signal (i.e., the first signal), which is to be output after one of two interacting circuit modules performs operation processing, to the other circuit module for performing other operation processing. The clock rate of the second clock may be determined according to the channel width of the data transmission channel, the data width of the interactive signal (i.e., the first signal) which needs to be transmitted, and the clock rate of the first clock.

In an implementation, the clock rate of the second clock and the clock rate of the first clock satisfy the following relationship: $H2 \geq (W1/W2) \times H1$.

Where H2 represents the clock rate of the second clock, H1 represents the clock rate of the first clock, W1 represents a sum of data widths of all signals which need to be transmitted, W2 represents the channel width of the transmission channel, and values of H1, H2, W1 and W2 are all greater than 0.

In an implementation, the signal which needs to be transmitted includes the first signal having a data width of W11, so that the clock rate H2 of the second clock and the clock rate H1 of the first clock satisfy the following relationship: $H2 \geq (W11/W2) \times H1$, where H1, H2, W11 and W2 are all greater than 0.

Illustratively, as shown in FIG. 3, the large-scale digital circuit is divided into two circuit modules, including the current circuit module and the target circuit module, which perform the first operation processing and the second operation processing respectively, the two circuit modules are both controlled by the first clock signal provided by one first clock (e.g., the low-speed clock with the clock rate of 1 MHz), and the interactive signals between the two circuit modules include the first signal to be output to the second circuit module by the current circuit module after performing the first operation processing. The data width W11 of the first signal is 100 bits, the channel width W2 of the transmission channel of the data transmission module is 2 bits, the clock rate H1 of the first clock is 1 MHz, 2 bits of the first signal is transmitted in one clock cycle of the second clock, and the 100-bit first signal needs to be transmitted within at least 50 clock cycles of the second clock, so that it can be determined that the clock rate H2 of the second clock is greater than or equal to 50 MHz.

Illustratively, assuming that a large-scale circuit needs to perform a function of D=A op1 B op2 C, where op1 and op2 represent some operation processes, which are not specifically limited herein. Operation processing of D may be divided into two phases: T=A op1 B, D=T op2 C. A op1 B represents the first operation processing, T op2 C represents the second operation processing, A and B represent the input signals for performing the first operation processing, T represents the first signal output after the first operation processing is performed, and C represents the second signal for performing the second operation processing. clk1 represents the first clock, and clk2 represents the second clock. Assuming that a data width W1 of the signal T is 100 bits, the channel width W2 of the data transmission module is 2 bits, the clock rate H1 of clk1 is 1 MHz, 2 bits of the signal T is transmitted in one clock cycle of clk2, and the 100-bit signal T needs to be transmitted within at least 50 clock cycles of clk2, so that the clock rate H2 of clk2 can be designed to be greater than or equal to 50 MHz. Thus, the signal T is transmitted to the signal C through the 2-bit data transmission channel within one clock cycle of clk1, and meanwhile the transmission of the signal T is completed within 50 clock cycles of clk2.

In an implementation, the signals which need to be transmitted include the first signal and the third signal, the data width of the first signal is W11, and a data width of the third signal is W13, so that the clock rate H2 of the second clock and the clock rate H1 of the first clock satisfy the following relationship: $H2 \geq ((W11+W13)/W2) \times H1$, where H1, H2, W11, W13 and W2 are all greater than 0.

In some embodiments, the digital circuit is divided into three circuit modules, the first signal output by the first circuit module after performing the first operation processing is transmitted to the second circuit module through the first data transmission module, the second circuit module outputs the third signal after performing the second operation processing according to the second signal and the first signal, and the third signal is transmitted to the third circuit module through the second data transmission module. The clock rate of the second clock may be determined according to a channel width of the first data transmission module, a data width of the first signal transmitted from the first circuit module to the second circuit module, a data width of the third signal transmitted from the second circuit module to the third circuit module, and the clock rate of the first clock.

Illustratively, as shown in FIG. 5, a data width W11 of the signal 1 is 2 bits, a data width W13 of the signal 3 is 98 bits, a channel width W2 of a transmission channel of the data transmission module is 2 bits, the clock rate H1 of the first clock is 1 MHz, 2 bits of a signal is transmitted in one clock cycle of the second clock, and the signal 1 and the signal 3, a sum of whose data widths is 100 bits, need to be transmitted within at least 50 clock cycles of the second clock, so that it can be determined that the clock rate H2 of the second clock is greater than or equal to 50 MHz.

In some embodiments, the data transmission module is configured to transmit the signal, which is output by the current circuit module in the two interacting circuit modules after performing the operation processing, to the target circuit module for performing other operation processing, and is further configured to feed an output signal, which is generated after the target circuit module performs operation processing, back to the current circuit module for performing other operation processing. The clock rate of the second clock may be determined according to the channel width of the data transmission channel, the data width of the first signal transmitted from the current circuit module to the target circuit module, the data width of the third signal transmitted from the target circuit module to the current circuit module, and the clock rate of the first clock.

Illustratively, as shown in FIG. 7, the large-scale digital circuit is divided into two circuit modules, including the current circuit module and the target circuit module, which perform the first operation processing and the second operation processing respectively, the two circuit modules are both controlled by the first clock signal provided by one first clock (e.g., the low-speed clock with the clock rate of 1 MHz), and the interactive signals between the two circuit modules include the first signal output to the second circuit module by the current circuit module after performing the first operation processing, and the third signal fed back to the first circuit module by the target circuit module after performing the second operation processing. The data width W11 of the first signal is 2 bits, the data width W13 of the third signal is 98 bits, the channel width W2 of the transmission channel of the data transmission module is 2 bits, the clock rate H1 of the first clock is 1 MHz, 2 bits of a signal is transmitted in one clock cycle of the second clock, and the first signal and the third signal, a sum of whose data widths is 100 bits, need to be transmitted within at least 50 clock cycles of the second clock, so that it can be determined that the clock rate H2 of the second clock is greater than or equal to 50 MHz.

Illustratively, assuming that a large-scale circuit needs to perform a function of P=X op1 Y, X=a ? Z op2 M:Z op3 N, where op1, op2 and op3 represent some operation processes, which are not specifically limited herein. Operation processing of P may be divided into two phases: X=a ? Z op2 M:Z op3 N, P=X op1 Y. Where a represents the first signal output after the first operation processing, X=a ? Z op2 M:Z op3 N represents the second operation processing, Z, M and N represent the second signal, X represents the third signal, P=X op1 Y represents the third operation processing, and Y represents the fourth signal. clk1 represents the first clock, and clk2 represents the second clock. For example, a data width W11 of the signal a is 2 bits, a data width W13 of the signal X is 98 bits, the channel width W2 of the data transmission module is 2 bits, the clock rate H1 of clk1 is 1 MHz, 2 bits of a signal is transmitted in one clock cycle of clk2, signals having a total data width of 100 bits (a sum of the data width W11 of the signal a and the data width W13 of the signal X) need to be transmitted and need to be transmitted within at least 50 clock cycles of clk2, so that the clock rate H2 of clk2 can be set to be greater than or equal to 50 MHz. Thus, the signal a and the signal X are transmitted within one clock cycle of clk1 for performing the second operation processing and the third operation processing respectively, and meanwhile the transmission of the signal a and the transmission of the signal X are completed within 50 clock cycles of clk2.

According to the technical solutions of the signal transmission method provided by the present disclosure, a large-scale digital circuit is divided into a plurality of circuit modules connected in series, each circuit module is configured to perform its own function (perform corresponding operation processing, such as a combinational logic operation processing), data transmission is controlled by a high-speed clock, and a high-speed data transmission channel operating based on a clock cycle of the second clock (e.g., the high-speed clock) is provided between any two adjacent circuit modules, so that the operation processing of the plurality of circuit modules and the transmission of the interactive signals between any two adjacent circuit modules can be completed within one clock cycle of the first clock (e.g., one clock cycle of a low-speed clock), without incurring a delay of additional low-speed clock cycle. Thus, the large-scale circuit can produce, when performing simulation, a complete simulation effect which is same as an effect produced in a case where all the circuit modules perform calculation as a whole circuit module.

Figure 10:
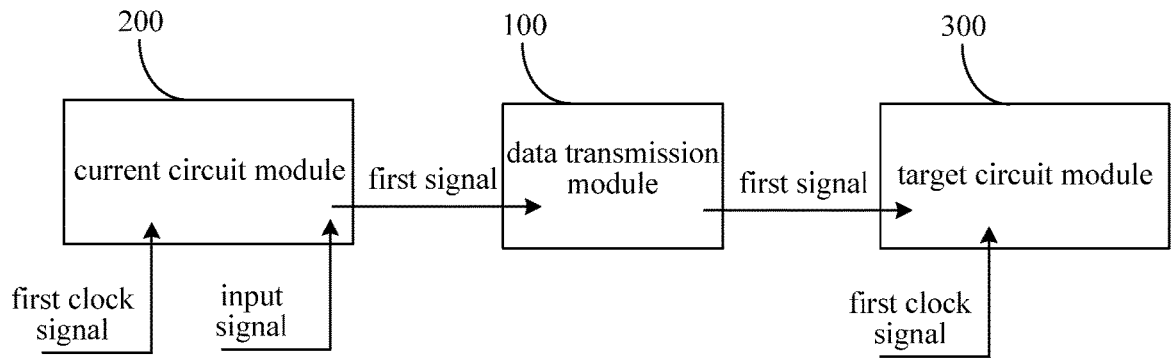
FIG. 10 is a schematic structural diagram of a signal transmission device according to the present disclosure.

FIG. 10 is a schematic structural diagram of a signal transmission device according to the present disclosure. As shown in FIG. 10, the present disclosure provides a signal transmission device applied to a digital circuit including a plurality of circuit modules connected in series, and each circuit module is configured to perform corresponding operation processing based on a first clock signal provided by a first clock. The signal transmission device includes: a data transmission module 100 disposed between any two adjacent circuit modules, and configured to transmit, under driving of a second clock signal provided by a second clock, a first signal output by a current circuit module 200 to a target circuit module 300 in response to reception of the first signal.

The current circuit module 200 and the target circuit module 300 are any two adjacent circuit modules, the first signal is a signal output by the current circuit module 200 when operating based on the first clock signal, the transmission of the first signal is completed within a current clock cycle of the first clock, and a clock rate H2 of the second clock is greater than a clock rate H1 of the first clock.

The signal transmission device provided by the present disclosure is applied to a large-scale digital circuit, which may be logically divided according to functions to be performed thereby into a plurality of circuit modules connected in series, each circuit module performs its own function (performs corresponding operation processing, such as a combinational logic operation processing), and data transmission is controlled by a high-speed clock to allow operation processing of the plurality of circuit modules and transmission of interactive signals between any two adjacent circuit modules to be completed within one clock cycle of a low-speed clock (e.g., the first clock with a clock rate of 1 MHz). The whole process takes one low-speed clock cycle without consuming any additional low-speed clock cycle, so that the large-scale circuit can produce, when performing simulation, a complete simulation effect which is same as an effect produced in a case where all the circuit modules perform calculation as a whole circuit module.

The first clock signal may be a synchronous clock signal provided for each independent circuit module in the entire large-scale circuit, and may trigger on a rising edge or a falling edge (hereinafter referred to as a clock edge) to enable each circuit module to perform corresponding operation processing under driving of the first clock signal, and a triggering way of the first clock signal is not limited herein. Different from the first clock signal, the second clock signal is a clock signal provided for the data transmission module 100, and may trigger on a rising edge or a falling edge (hereinafter referred to as the clock edge) to enable the data transmission module between any two adjacent circuit modules to perform signal transmission, and a triggering way of the second clock signal is not limited herein. The first clock and the second clock have different clock rates and different clock cycles, and the clock rate of the second clock is greater than that of the first clock.

In an implementation, the clock rate H2 of the second clock is determined according to a channel width W2 of the data transmission module 100, a sum W1 of data widths of all signals which need to be transmitted, and the clock rate H1 of the first clock, and it is satisfied that $H2 \geq (W1/W2) \times H1$, where H1, H2, W1 and W2 are all greater than 0.

In an implementation, as shown in FIG. 10, the device includes: the current circuit module 200, which is controlled by the first clock signal, and is configured to enable an input signal to respond to the first clock signal when being triggered on a clock edge of the first clock signal, and in the current clock cycle of the first clock, perform a first operation processing according to the input signal of the current circuit module 200 to obtain the first signal and output the first signal to the data transmission module 100. The data transmission module 100 is configured to receive the second clock signal provided by the second clock, enable the first signal to respond to the second clock signal when being triggered on a clock edge of the second clock signal, and in the current clock cycle of the first clock, transmit the first signal to the target circuit module 300 in response to the reception of the first signal output by the current circuit module 200. The target circuit module 300 is controlled by the first clock signal, and is configured to enable a second signal to respond to the first clock signal when being triggered on a clock edge of the first clock signal, and in the current clock cycle of the first clock, perform a second operation processing according to the second signal and the first signal to obtain a third signal in response to reception of the first signal and register the third signal.

In an implementation, the digital circuit is logically divided into two circuit modules, which are respectively a first circuit module and a second circuit module. The first circuit module and the second circuit module perform the first operation processing and the second operation processing respectively, the two circuit modules are both controlled by one low-speed clock (e.g., the first clock with a clock rate of 1 MHz), and interactive signals between the two circuit modules include the first signal which needs to be output to the second circuit module by the first circuit module after performing the first operation processing. In such case, the first circuit module serves as the current circuit module 200, and the second circuit module serves as the target circuit module 300.

In another implementation, the digital circuit is logically divided into two circuit modules, which are respectively the first circuit module and the second circuit module. The first circuit module performs the first operation processing and the third operation processing, the second circuit module performs the second operation processing, the two circuit modules are both controlled by one low-speed clock (e.g., the first clock with a clock rate of 1 MHz), and interactive signals between the two circuit modules include the first signal output by the first circuit module after performing the first operation processing, and the third signal fed back by the second circuit module after performing the second operation processing (the first signal is an output signal among the interactive signals, and the third signal is a feedback signal among the interactive signals). In such case, the first circuit module serves as the current circuit module 200, and the second circuit module serves as the target circuit module 300.

The first circuit module may perform the first operation processing according to an input signal and/or a registered signal to obtain the first signal, and the registered signal may be a signal obtained by the first circuit module when performing operation processing in a historical clock cycle of the first clock, with the historical clock cycle being a clock cycle before the current clock cycle.

In an implementation, the second signal includes at least one of the following signals: an input signal of the target circuit module 300; a signal obtained by the target circuit module 300 when performing operation processing in the current clock cycle of the first clock; and a signal obtained by the target circuit module 300 when performing operation processing in a historical clock cycle of the first clock, with the historical clock cycle being a clock cycle before the current clock cycle.

Figure 11:
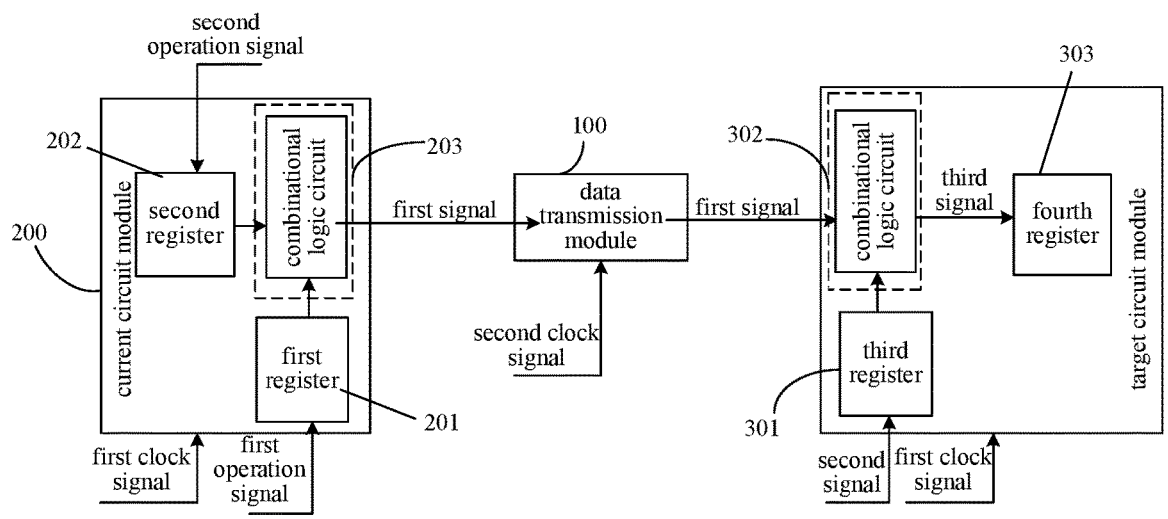
FIG. 11 is a schematic structural diagram of a circuit module according to the present disclosure.

FIG. 11 is a schematic structural diagram of a circuit module according to the present disclosure. In an implementation, input signals include a first operation signal and a second operation signal. As shown in FIG. 11, the current circuit module 200 includes: a first register 201, a second register 202, and a first operation processing unit 203.

The first register 201 is controlled by the first clock signal, and is configured to be triggered on a clock edge of the first clock signal to register the first operation signal; the second register 202 is controlled by the first clock signal, and is configured to be triggered on a clock edge of the first clock signal to register the second operation signal; and the first operation processing unit 203 is configured to perform the first operation processing on the first operation signal and the second operation signal to obtain the first signal and output the first signal to the data transmission module 100 in the current clock cycle of the first clock signal.

The first clock signal is provided to simultaneously control the first register and the second register. When the first clock signal triggers on a clock edge, the input signals (including the first operation signal and the second operation signal) input to the first circuit module respond to the first clock signal, and the first circuit module may perform the first operation processing on the input signals with a combinational logic circuit, and output the first signal after a combinational logic operation processing is completed.

In an implementation, as shown in FIG. 11, the target circuit module 300 includes: a third register 301 and a second operation processing unit 302. The third register 301 is controlled by the first clock signal provided by the first clock, and is configured to be triggered on a clock edge of the first clock signal to register the second signal; and the second operation processing unit 302 is configured to perform, in the current clock cycle of the first clock signal, a second operation processing on the second signal and the first signal in response to reception of the first signal to obtain the third signal.

In another implementation, as shown in FIG. 11, the target circuit module further includes a fourth register 303, which is controlled by the first clock signal, and is configured to be triggered on a clock edge of the first clock signal to register the third signal.

The first clock signal is provided to control the third register 301 and the fourth register 303, and the second signal for performing the second operation processing may be input to the third register. When the first clock signal triggers on a clock edge, the second signal responds to the first clock signal, the second circuit module may perform the second operation processing on the second signal and the first signal with a combinational logic circuit after receiving the first signal, and obtain the third signal after a combinational logic operation processing is completed, and the third signal is output after being registered in the fourth register 303.

In an implementation, the second operation processing unit 302 of the target circuit module 300 is further configured to feed the third signal back to the data transmission module 100. In an implementation, the data transmission module 100 is further configured to: transmit, under the driving of the second clock signal, the third signal output by the target circuit module 300 to the current circuit module 200 in response to reception of the third signal, so as to enable the current circuit module 200 to perform the third operation processing according to the third signal. The third signal is a signal which needs to be fed back to the current circuit module 200 by the target circuit module 300 after performing the second operation processing according to the first signal, the third operation processing is completely performed within the current clock cycle of the first clock, and transmission of the third signal is completed within the current clock cycle of the first clock. In an implementation, the current circuit module 200 is further configured to perform, in the current clock cycle of the first clock, a third operation processing according to the third signal and a fourth signal in response to reception of the third signal to obtain a fifth signal when being triggered on a clock edge of the first clock signal.

Figure 12:
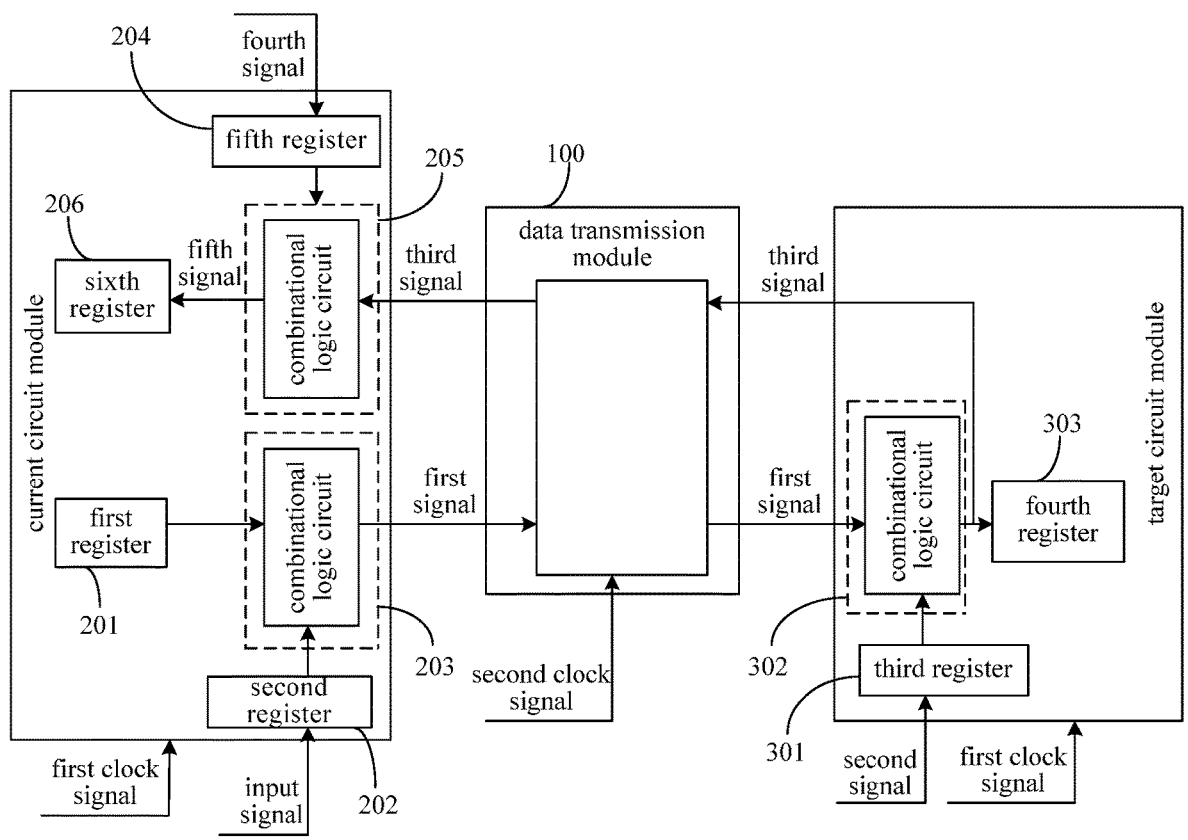
FIG. 12 is another schematic structural diagram of a circuit module according to the present disclosure.

In an implementation, the fourth signal includes at least one of the following signals: an input signal received by the current circuit module 200 in the current clock cycle of the first clock; a signal obtained by the current circuit module 200 when performing operation processing in the current clock cycle of the first clock; and a signal obtained by the current circuit module 200 when performing operation processing in a historical clock cycle of the first clock, with the historical clock cycle being a clock cycle before the current clock cycle FIG. 12 is another schematic structural diagram of a circuit module according to the present disclosure. In an implementation, as shown in FIG. 12, the current circuit module 200 further includes a fifth register 204, a third operation processing unit 205, and a sixth register 206. The fifth register 204 is controlled by the first clock signal, and is configured to be triggered on a clock edge of the first clock signal to register the fourth signal. The third operation processing unit 205 is configured to perform, in the current clock cycle of the first clock, the third operation processing on the third signal and the fourth signal in response to reception of the third signal to obtain the fifth signal. The sixth register 206 is controlled by the first clock signal, and is configured to be triggered on a clock edge of the first clock signal to register the fifth signal.

In an implementation, the digital circuit may be divided into three or more circuit modules, and each circuit module may adopt the structure of the current circuit module shown in FIG. 11 or FIG. 12, which will not be descripted in detail here. The present disclosure further relates to an electronic device including a server, a terminal, etc. The electronic device includes: at least one processor; a memory which communicates with and is connected to the at least one processor; and a communication component which communicates with and is connected to a storage medium and is configured to receive and transmit data under the control of the processor. The memory has stored instructions executable by the at least one processor, and when the instructions are executed by the at least one processor, the at least one processor implements the signal transmission method described in any one of the above embodiments.

In an implementation, as a non-volatile computer-readable storage medium, the memory may be configured to store non-volatile software programs, non-volatile computer-executable programs and modules. The processor executes various functional applications of a device and performs data processing by running the non-volatile software programs, instructions and the modules stored in the memory, that is, implementing the above signal transmission method. The memory may include a program storage region and a data storage region, and the program storage region may store an operating system, and an application program required by at least one function; and the data storage region may store a list of options, etc. Further, the memory may include a high-speed random access memory, and may also include a non-volatile memory, such as at least one magnetic disk, a flash memory, or other non-volatile solid-state memories. In some embodiments, the memory may optionally include a memory remotely arranged relative to the processor, and the remote memory may be connected to an external device via a network. Examples of the network include, but are not limited to, the Internet, an intranet, a local area network, a mobile communication network, and combinations thereof. One or more modules are stored in the memory and perform, when executed by one or more processors, the signal transmission method described in any one of the above embodiments. The product described above can perform the signal transmission method provided by the embodiments of the present disclosure, is provided with functional modules corresponding to the implementation of the method and can produce beneficial effects. Reference may be made to the signal transmission method provided by the embodiments of the present disclosure for technical details which are not described in details in the embodiments of the present disclosure.

The present disclosure further relates to a computer-readable storage medium configured to store a computer-readable program, which is used by a computer to implement some or all of the embodiments of the signal transmission method described above. That is, as can be understood by those of ordinary skill in the art, implementation of all or part of the steps of the method described in the above embodiments may be achieved by a program instructing related hardware, and the program is stored in a storage medium and includes several instructions to enable a device (which may be a single chip, a chip, etc.) or a processor to perform all or part of the steps of the method described in all the embodiments of the present application. The above storage medium includes: a Universal Serial Bus Flash Disk (a USB flash disk), a mobile hard disk, a Read-Only Memory (ROM), a Random Access Memory (RAM), a magnetic disk, an optical disc, or various media capable of storing program codes.

A large number of specific details are given in the Description herein. However, it should be understood that the embodiments of the present disclosure may be implemented without those specific details. In some examples, well-known methods, structures and techniques are not specifically illustrated for not obscuring understanding of the Description. Moreover, it should be understood by those of ordinary skill in the art that, although some embodiments described herein include some features, but not other features, included in other embodiments, the combinations of the features of different embodiments are intended to fall within the scope of the present disclosure and form different embodiments. For example, any one of the claimed embodiments in the claims may be implemented in the form of a combination.

It should be understood by those of ordinary skill in the art that, although the present disclosure is described with reference to the exemplary embodiments, various changes can be made to the present disclosure and equivalents can be used to replace the elements described in the present disclosure without departing from the scope of the present disclosure. In addition, if not departing from the essential scope of the present disclosure, many modifications can be made to adapt a particular situation or material to the teachings of the present disclosure. Therefore, the present disclosure is not limited to the specific embodiments disclosed herein, and includes all embodiments that fall within the scope of the appended claims.

What is claimed is:

1. A signal transmission method, which is applied to a digital circuit comprising a plurality of circuit modules connected in series, with each circuit module configured to perform corresponding operation processing based on a first clock signal provided by a first clock, and the signal transmission method comprises:
    transmitting by a data transmission module, under driving of a second clock signal provided by a second clock, a first signal output by a current circuit module to a target circuit module in response to reception of the first signal,
    wherein the current circuit module and the target circuit module are any two adjacent circuit modules, the first signal is a signal output by the current circuit module when operating based on the first clock signal, transmission of the first signal is completed within a current clock cycle of the first clock, and a clock rate of the second clock is greater than that of the first clock,
    wherein transmitting the first signal output by the current circuit module to the target circuit module in response to the reception of the first signal comprises:
    receiving the second clock signal provided by the second clock; and
    transmitting, in response to the reception of the first signal output by the current circuit module, the first signal to the target circuit module in the current clock cycle of the first clock when being triggered on a clock edge of the second clock signal, and
    the target circuit module is configured to perform a second operation processing according to the first signal and a second signal, and the second operation processing is completely performed within the current clock cycle of the first clock.

2. The method of claim 1, wherein the first signal comprises at least one of following signals:
    a signal obtained by the current circuit module when performing operation processing in the current clock cycle of the first clock; and
    a signal obtained by the current circuit module when performing operation processing in a historical clock cycle of the first clock, with the historical clock cycle being a clock cycle before the current clock cycle.

3. The method of claim 2, wherein the first signal comprises the signal obtained by the current circuit module when performing operation processing in the current clock cycle of the first clock, and the current circuit module is controlled by the first clock signal;
    the current circuit module is configured to perform a first operation processing according to an input signal of the current circuit module to obtain and output the first signal in the current clock cycle of the first clock when being triggered on a clock edge of the first clock signal; and
    the first operation processing is completely performed within the current clock cycle of the first clock.

4. The method of claim 1, wherein the second signal comprises at least one of following signals:
    an input signal of the target circuit module;
    a signal obtained by the target circuit module when performing operation processing in the current clock cycle of the first clock; and
    a signal obtained by the target circuit module when performing operation processing in a historical clock cycle of the first clock, with the historical clock cycle being a clock cycle before the current clock cycle.

5. The method of claim 1, wherein the target circuit module is controlled by the first clock signal, and
    the target circuit module is configured to perform, in response to reception of the first signal, the second operation processing according to the second signal and the first signal to obtain a third signal in the current clock cycle of the first clock when being triggered on a clock edge of the first clock signal.

6. The method of claim 1, after transmitting the first signal to the target circuit module, further comprising:
    transmitting, under the driving of the second clock signal, a third signal output by the target circuit module to the current circuit module in response to reception of the third signal, so as to enable the current circuit module to perform a third operation processing according to the third signal,
    wherein the third signal is a signal which needs to be fed back to the current circuit module by the target circuit module after performing a second operation processing according to the first signal, the third operation processing is completely performed within the current clock cycle of the first clock, and transmission of the third signal is completed within the current clock cycle of the first clock.

7. The method of claim 6, wherein the current circuit module is configured to perform, in response to reception of the third signal, the third operation processing according to the third signal and a fourth signal to obtain a fifth signal in the current clock cycle of the first clock when being triggered on a clock edge of the first clock signal.

8. The method of claim 7, wherein the fourth signal comprises at least one of following signals:
    an input signal received by the current circuit module in the current clock cycle of the first clock;
    a signal obtained by the current circuit module when performing operation processing in the current clock cycle of the first clock; and
    a signal obtained by the current circuit module when performing operation processing in a historical clock cycle of the first clock, with the historical clock cycle being a clock cycle before the current clock cycle.

9. The method of claim 1, further comprising:
    determining the clock rate of the second clock according to the clock rate of the first clock.

10. The method of claim 9, wherein determining the clock rate of the second clock according to the clock rate of the first clock comprises:
    determining a channel width of a signal transmission channel between the current circuit module and the target circuit module, and a data width of a signal which needs to be transmitted; and determining the clock rate of the second clock according to the channel width, the data width, and the clock rate of the first clock.

11. The method of claim 10, wherein the clock rate of the second clock and the clock rate of the first clock satisfy a following relationship:

$$H2 \geq (W1/W2) \times H1,$$

where H2 represents the clock rate of the second clock, H1 represents the clock rate of the first clock, W1 represents a sum of data widths of all signals which need to be transmitted, W2 represents the channel width, and values of H1, H2, W1 and W2 are all greater than 0.

12. A signal transmission device, which is applied to a digital circuit comprising a plurality of circuit modules connected in series, with each circuit module configured to perform corresponding operation processing based on a first clock signal provided by a first clock, and the signal transmission device comprises:
   a data transmission module disposed between any two adjacent circuit modules, and configured to transmit, under driving of a second clock signal provided by a second clock, a first signal output by a current circuit module to a target circuit module in response to reception of the first signal,
   wherein the current circuit module and the target circuit module are any two adjacent circuit modules, the first signal is a signal output by the current circuit module when operating based on the first clock signal, transmission of the first signal is completed within a current clock cycle of the first clock, and a clock rate of the second clock is greater than that of the first clock,
   wherein the current circuit module is controlled by the first clock signal, and is configured to perform a first operation processing according to an input signal of the current circuit module to obtain the first signal and output the first signal to the data transmission module in the current clock cycle of the first clock when being triggered on a clock edge of the first clock signal;
   the data transmission module is configured to receive the second clock signal provided by the second clock, and transmit, in response to the reception of the first signal output by the current circuit module, the first signal to the target circuit module in the current clock cycle of the first clock when being triggered a clock edge of the second clock signal; and
   the target circuit module is controlled by the first clock signal, and is configured to perform, in response to reception of the first signal, a second operation processing according to a second signal and the first signal to obtain a third signal and register the third signal in the current clock cycle of the first clock when being triggered a clock edge of the first clock signal.

13. The device of claim 12, wherein the second signal comprises at least one of following signals:
   an input signal of the target circuit module;
   a signal obtained by the target circuit module when performing operation processing in the current clock cycle of the first clock; and
   a signal obtained by the target circuit module when performing operation processing in a historical clock cycle of the first clock, with the historical clock cycle being a clock cycle before the current clock cycle.

14. The device of claim 12, wherein the input signal of the current circuit module comprises a first operation signal and a second operation signal, and the current circuit module comprises:
   a first register, which is controlled by the first clock signal, and is configured to be triggered on a clock edge of the first clock signal to register the first operation signal;
   a second register, which is controlled by the first clock signal, and is configured to be triggered on a clock edge of the first clock signal to register the second operation signal; and
   a first operation processing unit, which is configured to perform the first operation processing on the first operation signal and the second operation signal to obtain the first signal and output the first signal to the data transmission module in the current clock cycle of the first clock signal.

15. The device of claim 12, wherein the target circuit module comprises:
   a third register, which is controlled by the first clock signal, and is configured to be triggered on a clock edge of the first clock signal to register the second signal; and
   a second operation processing unit, which is configured to perform, in response to reception of the first signal, the second operation processing on the second signal and the first signal in the current clock cycle of the first clock signal to obtain the third signal.

16. The device of claim 12, wherein the data transmission module is further configured to:
   transmit, under the driving of the second clock signal, a third signal output by the target circuit module to the current circuit module in response to reception of the third signal, so as to enable the current circuit module to perform a third operation processing according to the third signal; and
   wherein the third signal is a signal which needs to be fed back to the current circuit module by the target circuit module after performing a second operation processing according to the first signal, the third operation processing is completely performed within the current clock cycle of the first clock, and transmission of the third signal is completed within the current clock cycle of the first clock.

17. The device of claim 16, wherein the current circuit module is configured to perform, in response to reception of the third signal, the third operation processing according to the third signal and a fourth signal to obtain a fifth signal in the current clock cycle of the first clock when being triggered on a clock edge of the first clock signal.

18. An electronic device, comprising a memory configured to store one or more computer instructions, and a processor, wherein when the one or more computer instructions are executed by the processor, the processor implements a signal transmission method, which is applied to a digital circuit comprising a plurality of circuit modules connected in series, with each circuit module configured to perform corresponding operation processing based on a first clock signal provided by a first clock, wherein the signal transmission method comprises:
   transmitting by a data transmission module, under driving of a second clock signal provided by a second clock, a first signal output by a current circuit module to a target circuit module in response to reception of the first signal,
   wherein the current circuit module and the target circuit module are any two adjacent circuit modules, the first signal is a signal output by the current circuit module when operating based on the first clock signal, transmission of the first signal is completed within a current clock cycle of the first clock, and a clock rate of the second clock is greater than that of the first clock, wherein transmitting the first signal output by the current circuit module to the target circuit module in response to the reception of the first signal comprises:

receiving the second clock signal provided by the second clock; and transmitting, in response to the reception of the first signal output by the current circuit module, the first signal to the target circuit module in the current clock cycle of the first clock when being triggered on a clock edge of the second clock signal, and the target circuit module is configured to perform a second operation processing according to the first signal and a second signal, and the second operation processing is completely performed within the current clock cycle of the first clock.

* * * * *